United States Patent
Fu et al.

[11] Patent Number: 5,807,787
[45] Date of Patent: Sep. 15, 1998

[54] METHOD FOR REDUCING SURFACE LEAKAGE CURRENT ON SEMICONDUCTOR INTERGRATED CIRCUITS DURING POLYIMIDE PASSIVATION

[75] Inventors: Wen-Jui Fu, Myau-Lih; Ho-Ku Lan; Ying-Chen Chao, both of Hsin-chu, all of Taiwan

[73] Assignee: Taiwan Semiconductor Manufacturing Company, Ltd., Hsin-Chu, Taiwan

[21] Appl. No.: 755,862

[22] Filed: Dec. 2, 1996

[51] Int. Cl.$^6$ .............................................. H01C 21/4762
[52] U.S. Cl. ......................... 438/623; 438/688; 438/974
[58] Field of Search ................................. 437/231, 183, 437/43; 438/630, 974, 603, 623, 688

[56] References Cited

U.S. PATENT DOCUMENTS

| | | | |
|---|---|---|---|
| 4,493,855 | 1/1985 | Sachdev et al. | 427/41 |
| 4,599,243 | 7/1986 | Sachdev et al. | 427/38 |
| 4,622,574 | 11/1986 | Garcia | 357/55 |
| 4,732,658 | 3/1988 | Lee | 437/228 |
| 5,229,324 | 7/1993 | Turner et al. | 437/185 |
| 5,364,806 | 11/1994 | Ma et al. | 437/43 |
| 5,414,287 | 5/1995 | Hong | 257/316 |
| 5,492,863 | 2/1996 | Higgins | 437/183 |
| 5,494,838 | 2/1996 | Chang et al. | 437/43 |

*Primary Examiner*—Charles L. Bowers, Jr.
*Assistant Examiner*—Reneé R. Berry
*Attorney, Agent, or Firm*—George O. Saile; Stephen B. Ackerman

[57] ABSTRACT

A method is achieved for reducing the surface leakage current between adjacent bonding pads on integrated circuit substrates after forming a patterned polyimide passivation layer. When the polyimide layer is patterned to open contacts areas over the bonding pads, plasma ashing in oxygen is used to remove residual polyimide that otherwise causes high contact resistance, and poor chip yield. This plasma ashing also modifies the insulating layer between bonding pads resulting in an unwanted increase in surface leakage currents between bonding pads. The passivation process is improved by using a thermal treatment step in either a nitrogen or air ambient after the plasma ashing to essentially eliminate the increased surface leakage current and improve chip yield.

23 Claims, 2 Drawing Sheets

METHOD FOR REDUCING SURFACE LEAKAGE CURRENT ON SEMICONDUCTOR INTERGRATED CIRCUITS DURING POLYIMIDE PASSIVATION

BACKGROUND OF THE INVENTION (1) Field of the Invention

The present invention relates to a method for reducing the surface leakage currents on integrated circuits after coating and patterning polyimide insulating layer for passivation, and more particularly, relates to a method for reducing the surface leakage current between bonding pads on integrated circuit chips.

(2) Description of the Prior Art

Integrated circuits formed in and on semiconductor substrate from semiconductor devices, such as field effect transistors (FETs) and/or bipolar transistors are typically electrically interconnected using multilayers of patterned conducting materials, such as doped polysilicon, refractory metal silicides and metal. Typically insulating layers, such as silicon oxide ($SiO_2$), are deposited by chemical vapor deposition (CVD) methods, over each patterned conducting layers to insulate the layer from the next level of patterned conducting layer. Contact openings or via holes are formed in the insulating layers prior to depositing the next conducting layer to form the interlevel connections to complete the required circuit function. Typically the last patterned level of metal on the substrate forms an array of bonding pads for each of the integrate circuits (chips) on the substrate. These bonding pads provide the contacts for the input/output (I/O) connections for I/O signals and also provide for the power/ground connections. The bonding pads are then passivated and electrically insulated by depositing a first passivation layer, such as silicon oxide or a silicon oxide/silicon nitride multilayer, which is usually deposited by chemical vapor deposition (CVD). Contact openings are then etched in this first passivation layer to the bonding pads, and a relatively thick, second passivation layer, usually composed of a polyimide, is coated on the substrate to further insulate and protect the integrate circuit from contamination and mechanical damage during and after the dicing process which separates the integrated circuits (chips) from the substrate. The chips are then mounted on a single or multi-chip carrier to which metal contacts are formed to the bonding pads, such as wire bonding, to complete the next level of electrical packaging.

In recent years photosensitive polyimide has attracted considerable interest as the passivation coating over the bonding pads. These photosensitive polyimides have the desirable properties of the more conventional polyimides, such as low dielectric constants, relatively high temperature stability (up to about 450° C.), planarizing properties, etc., but can also be patterned like a photoresist mask, and then remain on the substrate to serve as the passivation layer. This later attribute is highly desirable for reducing manufacturing cost. Typically a photosensitive polyimide precursor is coated on the substrate using, for example, conventional photoresist spin coating techniques. The photosensitive polyimide precursor, after a low temperature prebaked, is then exposed through a photo-mask or reticle using, for example, a step and repeat projection aligner and ultra violet (UV) radiation source. The UV exposed portions of the polyimide precursor are crosslinked while leaving unexposed regions over the bonding pads that are not crosslinked. During development, the unexposed polyimide precursor regions over the bonding pads are dissolved away providing openings over the bonding pad areas. Further thermal curing yields a permanent polyimide passivation layer which elsewhere on the substrate. A schematic cross sectional view of a portion of this bonding pad structure having the passivation layers is shown in FIG. 1. Shown are two adjacent bonding pads 4 composed of metal such as aluminum (Al) or an aluminium-copper alloy on a top insulating layer 10 which covers the semiconductor integrated circuit. The contacts between the bonding pads and the integrated circuit are not shown to simplify the drawing. The first passivation layer 12 is deposited over the bonding pads and contact openings 6 are etched in the insulating layer 12 to the bonding pads. The photosensitive polyimide passivation layer 14 is then spin-coated and patterned to provide openings over the bonding pads, as shown in FIG. 1.

Like photoresist processing, when the polyimide is removed over the bonding pads by dissolving away the non-crosslinked polyimide, a polyimide residue remains that can result in unwanted electrical opens or high contact resistance during testing and/or wire bonding. Typically a mild plasma ashing (plasma descumming) step is performed in an oxygen plasma to insure that the trace amounts of the polyimide residue are removed. Unfortunately, this plasma ashing can also effect the first passivation layer making the surface conductivity higher, and thereby resulting in significantly higher surface leakage currents across the insulating layer 12 (see FIG. 1) between the bonding pads 4. As semiconductor devices are further reduced in size and the circuit density increased, it will become even more important to minimize leakage currents to maintain circuit performance. Also, with further increase in circuit density and increasing I/O count on the chip the bonding pad pitch will further decrease. Therefore, there is an increasing need in the semiconductor industry to minimize the leakage currents on the integrated circuit.

SUMMARY OF THE INVENTION

It is a principle object of the present invention to provide a method for reducing the surface leakage current between bonding pads on a semiconductor integrated circuit after forming a polyimide passivation layer.

It is another object of the present invention to provide a photosensitive polyimide passivation process on semiconductor integrated circuit devices having very low surface leakage currents between adjacent bonding pads.

It is still another objective of this invention to achieve these low surface leakage currents between bonding pads while providing a cost effective manufacturing process.

The present invention is a process which utilizes a thermal treatment step after forming a patterned polyimide passivation layer on semiconductor integrated circuits. The thermal treatment reduces surface leakage currents between adjacent bonding pads on the chip to which the wire bonding leads are to be made The method starts by providing a semiconductor substrate on which are already formed the necessary discrete semiconductor devices, such as field effect transistors (FET's), bipolar transistor and similar devices. A multilayer of patterned conducting layers, such as doped polysilicon, silicides and metal with interposed insulating layers, such as chemical vapor deposited silicon oxides, are used to electrically interconnect the device, and thereby form the integrated circuit. The number of metal levels can vary depending on the circuit design, but are typically between about 2 to 4 layers. A top insulating layer, such as a silicon oxide, is provided with contact openings or via holes to the appropriate regions of the integrated circuit to which the input/out signals and the power and ground plane contacts are to be made. An array of electrically conducting bonding pads are then formed over the contact openings to provide the external wiring contacts for the single or multi-chip carrier. Typically the bonding pads are composed of aluminium or aluminium/copper alloys. Alternatively, aluminum/silicon and aluminum/copper/silicon alloys can also be utilized for making the bonding pads. A first passivation layer, typically a low temperature oxide, such as a plasma enhanced CVD oxide, is deposited over the bonding pads and openings are formed in the first passivation layer to the bonding pads. A much thicker second passivation layer, composed of a photosensitive polyimide, is deposited by spin coating a photosensitive polyimide precursor which is then exposed with ultra violet (UV) radiation through a mask to crosslink the polyimide. The polyimide regions over the bonding pads and over the first passivation layer between the bonding pads is masked from UV exposure (crosslinking) and is dissolved away. Conventional plasma ashing in oxygen ($O_2$) is then performed to remove trace amounts of polyimide residue from the bonding pads for minimizing contact electrical resistance. This ashing, unfortunately, increases the surface electrical conductivity on the first passivation layer between the bonding pads and thereby increases the surface leakage currents by about an order of magnitude. By the method of this invention, the substrate is thermally treated in air or nitrogen ambient which reduces the leakage current back to the previous values before the plasma ashing. This provides a polyimide passivation layer with improved (lower) surface leakage currents than the conventional process without the thermal treatment.

BRIEF DESCRIPTION OF THE DRAWINGS

The objects and other advantages of the invention will become more apparent in the preferred embodiment when read in conjunction with the following drawing, wherein.

DESCRIPTION OF THE PREFERRED EMBODIMENTS

Figure 1:
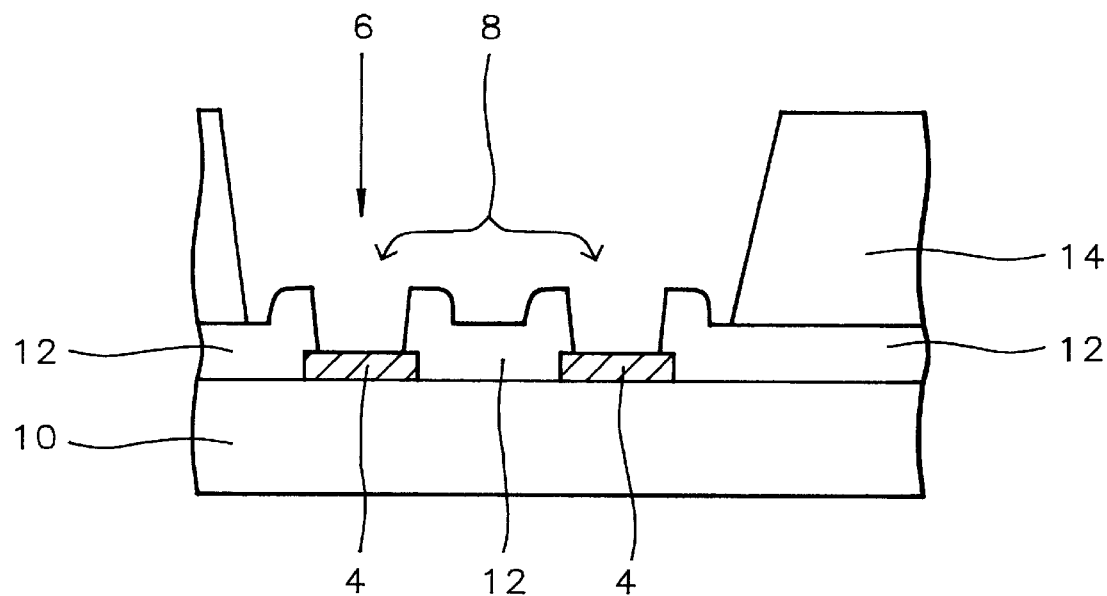
FIG. 1 is a schematic cross sectional view of a portion of a typical bonding pad area on the upper portion of a substrate. Only two adjacent I/O bonding pads of the many required on a chip are depicted in the Figure.

Prior to discussing the process with reference to the bonding pad structure in FIG. 1, it would be helpful in setting the invention in perspective by briefly describing the substrate structure on which the bonding pads structure are use. The most common used substrate is a semiconductor substrate, such as single crystalline silicon having a <100>axial orientation and conductively doped with a P or N type dopant. Typically field oxide regions are formed on and in the principle surface of the substrate to form electrically isolate regions. For example, a common method is the local oxidation of silicon (LOCOS) in which a patterned silicon nitride layer is used as a barrier to oxidation and the field oxide is formed by selectively oxidizing the substrate surface. Alternatively, trenches can be etched in the substrate, for example using an anisotropic plasma etch, and then filled with an insulator, such as a silicon oxide, to form planar recessed isolation regions. The semiconductor devices are then formed in the isolated silicon regions by conventional means, such as by using patterned doped polysilcon layer, ion implantation and dopant diffusions and the likes. Typically the patterned polysilicon also serve as part of the electrical interconnections. The semiconductor devices are then electrically wired up using a multilayer structure composed of alternate layers of patterned conducting and insulating layers. Typically the conducting layers are metal, such as aluminium or aluminium copper alloys, and are patterned using plasma etching. The interposing insulating layers are usually a low temperature silicon oxide, such as CVD silicon oxides ($SiO_2$). Interlevel contact openings (via holes) are etch in the insulating layer over each metal level to provide the required connections between the varies metal levels. This provides the wiring for the integrated circuit. The multilayer wiring can be an number of levels, but for practical reasons is usually limited to between about 2 to 4 levels. To complete the integrated circuit chip and provide electrical access to the circuit an array of bonding pads are formed over contact openings in a top insulating layer deposited over the multilayer wiring. These bonding pads provide the means for wire bonding the chips or die to the lead frame on a variety of chip carriers after the chips containing the integrated circuit are diced and picked from the substrate.

With continued down scaling of the semiconductor devices dimensions, the device parametric operating parameters, such as voltage and current, are also reduced, and therefore, it is very important to minimize the leakage currents in the circuit. In particular, it is important to maintain a low surface leakage current on the surface of the first passivation layer 12 between the adjacent bonding pads 4. However, in conventional processing after forming the bonding pads, a thick polyimide layer is typically used to passivity the integrated circuit from contamination and damage. A plasma ashing step is then required to remove residual polyimide over the bonding pad that would otherwise degrade the electrical contact during testing and wire bonding. Although the plasma ashing improves the electrical contact it is also known to effect the exposed passivation layer 12 between the bonding pads 4 results in excessive surface leakage currents between pads, as depicted in FIG. 1 by the double headed arrow 8.

Figure 2:
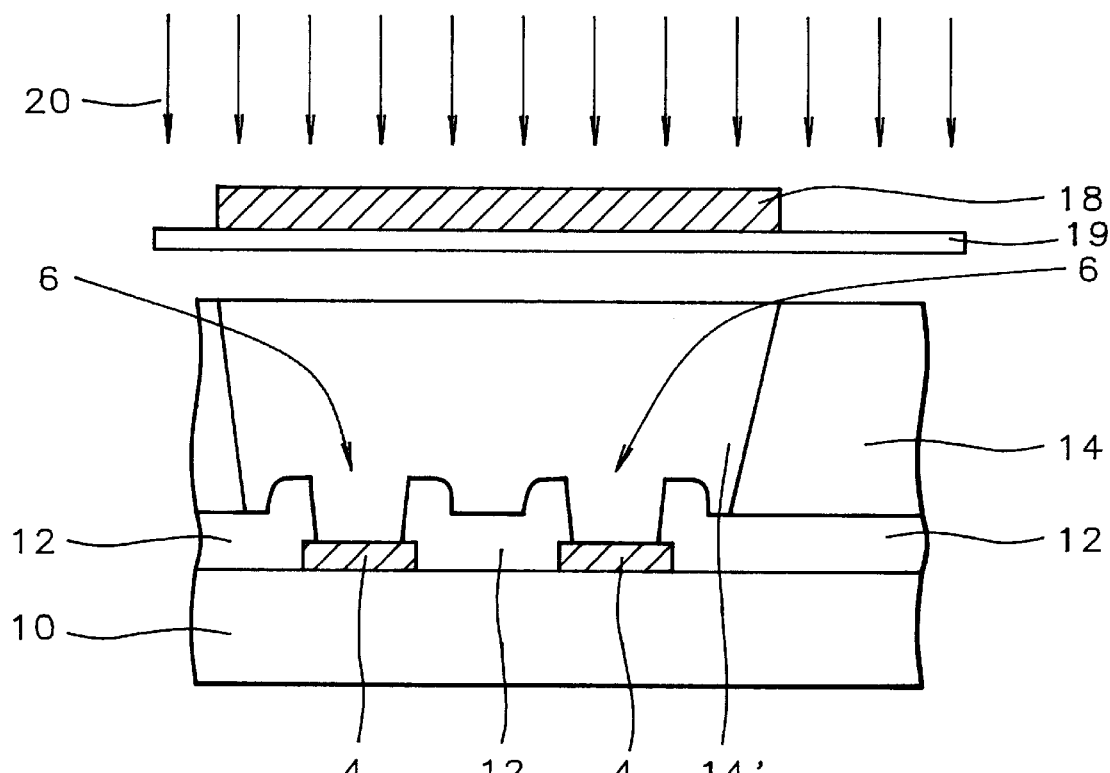
FIG. 2 is a schematic cross sectional view of a portion of a typical bonding pad area depicting the exposure of the photosensitive polyimide passivation layer using UV radiation and mask.
Figure 3:
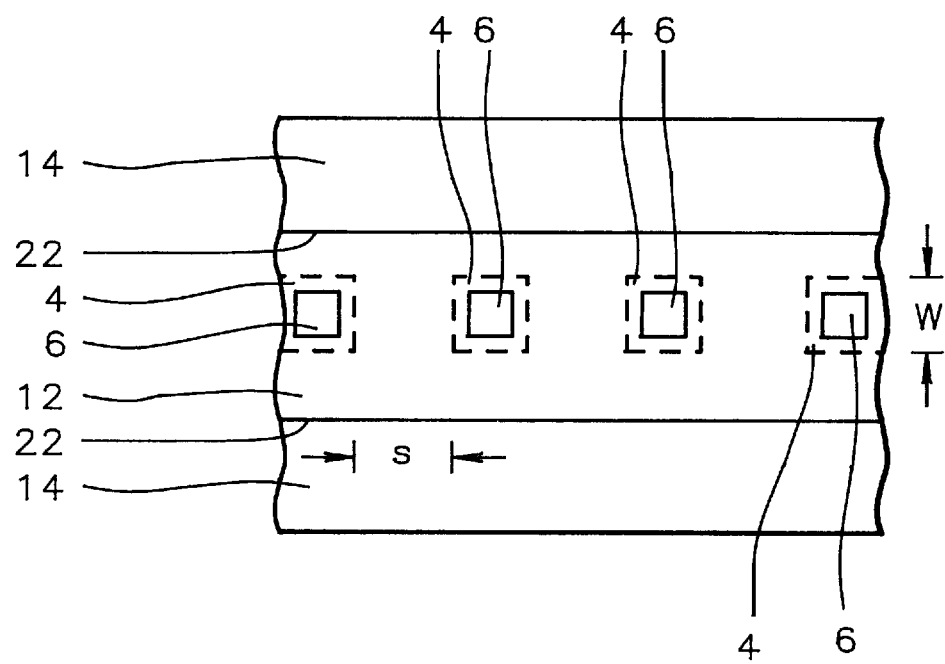
FIG. 3 is a schematic top view of an array of electrically isolated bonding pads used to measure the surface leakage current between bonding pads.

Referring now more specifically to FIGS. 2 and 3 and referring back to FIG. 1, the method of this invention is described for eliminating this excess surface leakage current. The method involves adding a thermal treatment to process for forming the passivation layer. This heat treatment is performed after the plasma ashing and essentially eliminates the surface leakage current caused by the plasma ashing.

Referring now to FIG. 2, a schematic cross sectional view, similar to FIG. 1 is shown of a portion of the bonding pad region on the substrate, but prior to patterning the second passivation layer 14. An insulating layer 10, referred to as the top insulating layer for the purpose of this invention, is first deposited over the integrated circuits (not shown) on the substrate. Using conventional photolithographic techniques and plasma etching, contact openings (also not shown) are etched in the layer 10 to the appropriate regions of the integrated circuit to electrically connect the array of bonding pads. Neither the integrated circuit nor the contact openings are depicted in FIGS. 2 or 1 to simplify the drawing. The bonding pads 4 are now formed on the top insulating layer 10 as shown for the upper portion of the substrate. A cross sectional view of only two adjacent bonding pads labeled 4 are shown in FIG. 2. The bonding pads 4 are typically formed by depositing a metal layer, such as aluminium, aluminum/copper, aluminum/silicon, or an aluminium/ copper/silicon alloy by physical vapor deposition, and then the metal layer is patterned using conventional photolithographic techniques and plasma etching. Typically the metal layer is between about 4000 and 8000 Angstroms thick. Alternatively, the bonding pads can be formed by evaporating the bonding pad metal through a metal mask which is aligned over the substrate in the evaporation system. For example, the physical vapor deposition can be accomplished by either resistive heating or electron bean evaporation. After the bonding pads 4 are formed, a first passivation layer 12 is deposited. Typically the first passivation layer 12 is composed of silicon oxide ($SiO_2$) or a silicon oxide/silicon nitride multilayer and is deposited by chemical vapor deposition (CVD). More specifically, a plasma enhance chemical vapor deposition (PECVD) can be used which can be deposited at relatively low temperatures, about 200 to 400° C. The reactant gas is typically a mixture of silane ($SiH_4$) and oxygen ($O_2$), or the $O_2$ can be replaced with $N_2O$ or $NH_3$ to form the silicon nitride. Layer 12 is typically deposited to a thickness of between about 7000 and 12000 Angstroms.

Openings 6, as shown in FIG. 2, are now etched in the first passivation layer 12 over and to the bonding pads 4. The etching can be achieved by conventional photoresist masking and plasma etching. For example, a typical plasma etch can be carried out in a reactive ion etcher (RIE) using for example a gas mixture of carbon tetrafluoride ($CF_4$) and a carrier gas such as argon (Ar).

Referring still to FIG. 2, the substrate surface is now passivated a second time using a second passivation layer 14. This passivation layer is usually considerably thicker, and besides providing electrical insulation also serves to protects the substrate from contamination and mechanical damage during subsequent chip processing. The second passivation layer 14 is typically composed of a polyimide, and is preferably a photosensitive polyimide which also serves as the photoresist mask. One preferred type of photosensitive polyimides is a PIMEL I-8320 AX from a series of polyimides marketed under the trade name PIMEL by the Asahi Chemical Industry Company LTD., of Japan, and can be used for the passivation layer 14. The PIMEL I-8320AX is applied by spin coated using a series of spin speeds ranging between about 1000 to 2500 rpm (revolutions per minute). After a pre-baked at about 95° C. the thickness of the polyimide is between about 9.0 to 12.0 $\mu$m (micrometers) thick. The photosensitive polyimide precursor (PIMEL I-8320AX) is then exposed using a photomask or reticle in conjunction with a g-line (436 nanometer wavelength) or i-line (365 nm wavelength) stepper. The exposure can be carried out in a g-line and i-line steppers, such as the Nikon, Inc. NSR-1505G2A, Nikon, Inc. NSR-1505i7A steppers, manufactured by Nikon, Inc. of Japan, or PAS-5500/100 stepper manufactured by ASMT, Inc. After developing the polyimide precursor the passivation layer 14 is then cured in nitrogen at a temperature of between about 350° to 400° C. for about 1.0 to 2.0 hours.

As shown in FIG. 2, the opaque portion 18 of the mask 19 over the bonding pad areas prevent the UV radiation 20 from crosslinking the photosensitive polyimide precursor layer 14', and therefore, is dissolved away in the developer while the crosslinked regions 14 remains as the second passivation layer 14 on the substrate, as shown in FIG. 1.

After patterning the second passivation layer 14 it is necessary to perform an oxygen plasma ashing step to remove residual polyimide that remains on the bonding pads that otherwise results in poor contact resistance and yield loss. This is best understood by reference to TABLE 1 below which shows the contact yield results before and after

TABLE 1

| PRODUCT | 1 PRIOR TO POLYIMIDE | 2 AFTER POLYIMIDE AND NO O2 ASHING | 3 AFTER POLYIMIDE AND O2 ASHING |
| --- | --- | --- | --- |
| SAMPLE YIELD | 92% | 68% | 91% |

The number of test wafers used in the sample size for determining the yields in TABLE 1 was 24. As is seen in TABLE 1, prior to coating the wafer with the polyimide, the bonding pad electrical yield is 92 percent (col. 1), while after coating and patterning the photo-sensitive polyimide, and before plasma ashing the yield degrades to 68% (col. 2) due to the polyimide residue on the pads. After the plasma ashing in oxygen ($O_2$) (col. 3) the yield recovers to 91%, which is about equal to the original yield in col. 1. Typically the plasma ashing is characterized to remove between about 700 to 750 Angstroms of polyimide.

Although the plasma ashing in oxygen reduces the bonding pad contact resistance and improves yield, it also modifies the exposed first passivation layer 12 (see FIG. 1), and thereby increases the surface electrical conductivity between adjacent bonding pads 4. This results in increased surface leakage current between pads, as depicted by the double headed arrow 8 in FIG. 1. For example, the surface leakage current can increase after ashing by an order of magnitude. For example the leakage current can increases from about 0.07 to 0.15 nA (nanoampere) to values greater than 1.0 nA, as will be described in more detail in the EXAMPLE provide below.

Now by the method of this invention, the increased surface leakage current resulting from the plasma ashing is essentially eliminated by subjecting the substrates to a thermal treatment after the plasma ashing. The substrate is preferably heated in an atmospheric ambient (air) to a temperature of between about 250° and 400° C. for a time equal to or greater than 3.0 minutes, and more specifically at a temperature of 250° C. for about 3.0 minutes. For example, the substrate can be heated to 250° C. on a hot plate for about 3.0 minutes. At the higher temperature to further improve the surface leakage currents, the wafers can be annealed in a furnace and then the oxygen can be excluded from the annealing furnace by purging with nitrogen to prevent the oxygen from attaching (damaging) the polyimide at the higher annealing temperatures. For example, a nitrogen purge can be used having less than 40 ppm (part per million) of oxygen, and the treatment temperature can be increased to between about 250° and 400° C., and for a time that is equal or greater than 1.0 hour, and more specifically the substrates can be heated to a temperature of 350° C. for about 2.0 hours to achieve the low leakage current. Either thermal treatment results in about an order of magnitude improvement in the surface leakage current.

To better appreciate the excellent results in lowering the surface leakage current, experimental results for a series of test wafers are presented in the EXAMPLE that follows.

EXAMPLE

Referring now to FIG. 3, a schematic top view of a portion of a test structure design is shown for measuring the surface leakage current between bonding pads. In these isolation test structure, unlike the actual bonding pads used on the integrated circuit product, the array of pads 4 are electrically isolated. This allows the leakage current between the pads to be measured. These bonding pads 4 are formed by patterned an aluminium metal over the top insulating layer 10 and then the first passivation layer 12 is deposited and openings 6 are etched to the bonding pads 4. The width W of the openings is about 0.1 mm (millimeters) and the spacing S between openings is also about 0.1 mm. The second passivation layer 14, composed of the photosensitive polyimide precursor, is deposited by spin coating. After a prebake at 95° C. on a hot plate the polyimide precursor is masked, and exposed with UV radiation and was developed to form the open stripe area 22 over the first passivation layer 12 and the pads 4, as shown in FIG. 3. The photosensitive polyimide was cured in nitrogen at a temperature of 250° C. for about 2.0 hours. Testing probes were contacted to the bonding pads and the surface leakage current was measured between adjacent pads at a compliance voltage of 0 to 10 volts between the pads. The surface leakage current between pads was measured using a HP-4062 instrument manufactured by Hewlett Packard, USA. The test results measured in nanoampere on these isolation test structure are shown below in TABLE 2 for 8 test samples.

TABLE 2

| TEST STURC-TURE | 1 AFTER POLYTMIDE nanoamp. | 2 AFTER O2 ASHING nanoamp. | 3 TREAT-MENT IN AIR nanoamp. | 4 TREATMENT IN NITROGEN nanoamp. |
|---|---|---|---|---|
| SAMPLE 1 | 0.24 | 2.02 | 0.14 | 0.08 |
| SAMPLE 2 | 0.10 | 0.67 | 0.05 | 0.01 |
| SAMPLE 3 | 0.09 | 0.64 | 0.05 | 0.01 |
| SAMPLE 4 | 0.11 | 1.03 | 0.05 | 0.01 |
| SAMPLE 5 | 0.12 | 1.09 | 0.08 | 0.02 |
| SAMPLE 6 | 0.07 | 0.46 | 0.10 | 0.01 |
| SAMPLE 7 | 0.15 | 0.98 | 0.05 | 0.05 |
| SAMPLE 8 | 0.14 | 0.97 | 0.09 | 0.05 |
| SAMPLE 9 | 0.14 | 0.75 | 0.05 | 0.14 |

As is clearly seen in TABLE 2, after polyimide processing (col. 1) the surface leakage current is between 0.07 to 0.24 nA, and after plasma ashing in $O_2$, increases by about an order of magnitude to between 0.46 to 2.02 nA (col. 2). However, after the thermal treatment in air (col. 3) at 250° C. for 3.0 minutes, by the method of this invention, the surface leakage current is reduced to between 0.05 to 0.14 nA, and after heat treatment in nitrogen (col. 4) at 350° C. for 2.0 hours the surface leakage current is reduced to between 0.01 to 0.14 nA, thereby demonstrating the improvement.

While the invention has been particularly shown and described with reference to the preferred embodiments thereof, it will be understood by those skilled in the art that various changes in form and details may be made without departing from the spirit and scope of the invention. Although the method was described specifically for bonding pads on semiconductor integrated circuits it should obvious to one skilled in the art that the method can be equally applied to substrates on which closely spaced bonding pads are required to contact interconnecting metallurgies.

What is claimed is:

1. A method of forming a polyimide passivation layer on semiconductor integrated circuits with reduced surface leakage currents between bonding pads, comprising the steps of;

providing a semiconducting substrate having semiconductor devices formed in and on said substrate, said semiconductor devices electrically connected by a multilayer of patterned electrical conducting layers and alternate insulating layers having interconnecting contact openings between said patterned conducting layers, and thereby providing said semiconductor integrated circuits;

depositing a top insulating layer;

etching contact openings in said top insulating layer to portions of said semiconductor integrated circuits;

forming an array of electrically conductive bonding pads on said top insulating layer and over said contact openings;

depositing a first passivation layer on said bonding pads and elsewhere on said substrate;

etching openings in said first passivation layer over and to the surface of said bonding pads;

depositing by spin coating a second passivation layer, composed of polyimide, on said first passivation layer and in said etched openings over said bonding pads;

patterning said polyimide second passivation layer removing portions over said array of bonding pads and over said first passivation layer between said bonding pads;

plasma ashing in oxygen said substrate surface, and thereby removing polyimide residue on said bonding pads, said plasma ashing also causing an increase in the surface leakage current on said first passivation layer between said bonding pads;

thermally treating said substrate, and thereby eliminating said increase in surface leakage current, and provide a polyimide passivation layer on said semiconductor integrated circuits having reduced surface leakage currents between said bonding pads.

2. The method of claim 1, wherein said bonding pads are composed of an aluminium/copper (Al/Cu) alloy.

3. The method of claim 1, wherein the thickness of said bonding pads is between about 4000 and 8000 Angstroms.

4. The method of claim 1, wherein said first passivation layer is silicon oxide/silicon nitride ($SiO_2/Si_3N_4$) deposited by chemical vapor deposition (CVD).

5. The method of claim 1, wherein the thickness of said first passivation layer is between about 4000 and 12000 Angstroms.

6. The method of claim 1, wherein said second passivation layer is a photosensitive polyimide.

7. The method of claim 1, wherein the thickness of said second passivation layer is between about 3.0 and 12.0 micrometers ($\mu$m).

8. The method of claim 6, wherein said patterning of said photosensitive polyimide is achieved by cross-linking with ultra violet (UV) radiation through a mask while masking from UV exposure polyimide regions over said bonding pads, and dissolving away in a solvent the non-crosslinked polyimide over said bonding pad areas.

9. The method of claim 1, wherein, said thermal treatment is in a nitrogen ($N_2$) gas ambient at a temperature of between about 250° and 400° C. for a time equal to or greater than 1.0 hour.

10. The method of claim 1, wherein, said thermal treatment is in air ambient at a temperature of between about 220° to 280° C. for a time equal to or greater than 3.0 minutes.

11. The method of claim 1, wherein said thermal treatment after said oxygen plasma ashing reduces said surface leakage current between said bonding pads by an order of magnitude.

12. The method of claim 1, wherein said thermal treatment after said oxygen plasma ashing reduces the surface leakage current from between about 1.0 to 2.0 nanoampere to between about 0.1 to 0.2 nanoampere.

13. A method of forming a polyimide passivation layer on semiconductor integrated circuits with reduced surface leakage currents between bonding pads, comprising the steps of;

providing a semiconducting substrate having semiconductor devices formed in and on said substrate, said semiconductor devices electrically connected by a multilayer of patterned electrical conducting layers and alternate insulating layers having interconnecting contact openings between said patterned conducting layers, and thereby providing said semiconductor integrated circuits;

depositing a top insulating layer;

etching contact openings in said top insulating layer to portions of said semiconductor integrated circuits;

forming an array of electrically conductive bonding pad on said top insulating layer and over said contact openings composed of aluminium;

depositing a first passivation layer on said bonding pads and elsewhere on said substrate composed of silicon oxide;

etching openings in said first passivation layer over and to the surface of said bonding pads;

depositing by spin coating a second passivation layer, composed of a photosensitive polyimide, on said first passivation layer and in said etched openings over said bonding pads;

patterning said polyimide second passivation layer removing portions over said array of bonding pads and over said first passivation layer between said bonding pads;

plasma ashing in oxygen said substrate surface, and thereby removing polyimide residue on said bonding pads, said plasma ashing also causing an increase in the surface leakage current on said first passivation layer between said bonding pads;

thermally treating said substrate in a nitrogen ($N_2$) ambient, and thereby eliminating said increase in surface leakage current, and provide a polyimide passivation layer on said semiconductor integrated circuits having reduced surface leakage currents between said bonding pads.

14. The method of claim 13, wherein said bonding pads are formed by depositing an aluminium (Al) layer and patterning using a photoresist etch mask and etching.

15. The method of claim 13, wherein said bonding pads are formed by physical evaporation of aluminium through a metal mask aligned over the substrate.

16. The method of claim 13, wherein the thickness of said bonding pads is between about 4000 and 8000 Angstroms.

17. The method of claim 13, wherein said first passivation layer composed of silicon oxide/silicon nitride ($SiO_2/Si_3N_4$) is deposited by chemical vapor deposition (CVD).

18. The method of claim 13, wherein the thickness of said first passivation layer is between about 7000 and 12000 Angstroms.

19. The method of claim 13, wherein the thickness of said second passivation layer is between about 3.0 and 12.0 micrometers ($\mu$m).

20. The method of claim 13, wherein said patterning of said photosensitive polyimide is achieved by cross-linking with ultra violet (UV) radiation through a mask while masking from UV exposure polyimide regions over said bonding pads, and dissolving away in a solvent the non-crosslinked polyimide over said bonding pad areas.

21. The method of claim 13, wherein, said thermal treatment in said nitrogen ($N_2$) gas ambient is at a temperature of between about 250° and 400° C. for a time equal to or greater than 1.0 hour.

22. The method of claim 13 wherein said thermal treatment after said oxygen plasma ashing reduces said surface leakage current between said bonding pads by an order of magnitude.

23. The method of claim 13 wherein said thermal treatment after said oxygen plasma ashing reduces the surface leakage current from between about 1.0 to 2.0 nanoampere to between about 0.1 to 0.2 nanoampere.

* * * * *